US008482299B2

(12) United States Patent
Pantke et al.

(10) Patent No.: US 8,482,299 B2
(45) Date of Patent: Jul. 9, 2013

(54) METHOD FOR DETECTING THE POSITION OF AN ARMATURE OF AN ELECTROMAGNETIC ACTUATOR

(75) Inventors: Michael Pantke, Friedrichshafen (DE); Jorg Kurth, Meckenbeuren (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 242 days.

(21) Appl. No.: 13/123,736

(22) PCT Filed: Sep. 10, 2009

(86) PCT No.: PCT/EP2009/061715

§ 371 (c)(1),
(2), (4) Date: Apr. 12, 2011

(87) PCT Pub. No.: WO2010/049200

PCT Pub. Date: May 6, 2010

(65) Prior Publication Data

US 2011/0221451 A1 Sep. 15, 2011

(30) Foreign Application Priority Data

Oct. 31, 2008 (DE) ........................ 10 2008 043 340

(51) Int. Cl.
*G01R 27/28* (2006.01)

(52) U.S. Cl.
USPC ............................ 324/654; 324/647; 324/600

(58) Field of Classification Search
None
See application file for complete search history.

(56) References Cited

U.S. PATENT DOCUMENTS

| | | | |
|---|---|---|---|
| 5,481,187 A | 1/1996 | Marcott et al. | |
| 5,578,904 A | 11/1996 | Marcott et al. | |
| 5,600,237 A | 2/1997 | Nippert | |
| 6,037,739 A | 3/2000 | Hartramph et al. | |
| 6,111,741 A | 8/2000 | Schmitz et al. | |
| 6,605,940 B1 | 8/2003 | Tabrizi et al. | |
| 6,870,454 B1 * | 3/2005 | Vladimirescu et al. | 335/220 |
| 6,949,923 B2 | 9/2005 | Schultz et al. | |
| 7,345,471 B2 * | 3/2008 | Sellen et al. | 324/207.12 |
| 7,804,674 B2 * | 9/2010 | Keller et al. | 361/152 |

FOREIGN PATENT DOCUMENTS

| | | | |
|---|---|---|---|
| DE | 221 006 | A1 | 4/1985 |
| DE | 197 48 647 | A1 | 4/1998 |
| DE | 298 14 211 | U1 | 11/1998 |
| DE | 100 20 896 | A1 | 10/2001 |
| DE | 100 33 923 | A1 | 1/2002 |
| DE | 100 34 830 | A1 | 2/2002 |
| DE | 10 2005 018 012 | A1 | 10/2006 |
| EP | 0 258 468 | A1 | 3/1988 |
| EP | 1 302 952 | A2 | 4/2003 |
| WO | 93/11369 | A1 | 6/1993 |
| WO | 98/38656 | A1 | 9/1998 |

* cited by examiner

*Primary Examiner* — Jermele M Hollington
*Assistant Examiner* — Trung Nguyen
(74) *Attorney, Agent, or Firm* — Davis & Bujold, PLLC

(57) ABSTRACT

A method of detecting the position of the armature (3) of an electromagnetic actuator arranged and able to move between first and second coils (1, 2), in which a voltage jump ($U_B$) is applied to the first and the second coils (1, 2) of the actuator connected in series. The first and the second coils (1, 2) form a voltage divider in accordance with the impedance coil principle. The voltage ($U_1$) of the first coil (1) and the voltage ($U_2$) of the second coil (2) are measured and, from the measurement data for the voltages at the first and the second coils (1, 2), the quotient of the difference ($\Delta U$) between the two voltage values and the voltage jump ($U_B$), normalized in relation to the size of the voltage jump ($U_B$) is calculated, and a specific armature stroke is correlated one-to-one with each value of the quotient.

4 Claims, 1 Drawing Sheet

METHOD FOR DETECTING THE POSITION OF AN ARMATURE OF AN ELECTROMAGNETIC ACTUATOR

This application is a National Stage completion of PCT/EP2009/061715 filed Sep. 10, 2009, which claims priority from German patent application serial no. 10 2008 043 340.3 filed Oct. 31, 2008.

FIELD OF THE INVENTION

The present invention relates to a method for detecting the position of an armature of an electromagnetic actuator, the armature being arranged and able to move between two coils.

BACKGROUND OF THE INVENTION

In the case of such two-coil actuators it is known to detect the position of the armature arranged and able to move between the coils, without needing an additional sensor. For this purpose the two coils are connected in series and a voltage jump is applied to the arrangement so that the two coils form a voltage divider in accordance with the impedance coil principle known from measurement technology. The position of the armature can be determined from the difference between the two voltages produced. For example, when the armature is in the first coil the voltage at the first coil at the beginning of the jump response will be higher than the voltage in the second coil; from the ratio of the voltages relative to the magnetic rise, a position-dependent displacement signal can be generated in a simple manner.

For example, from DE 10 2005018012 A1 by the present applicant an electromagnetic actuator and a method for controlling the actuator are known, the actuator consisting of an armature and two coils. In DE 10 2005108012 A1 it is proposed to measure the voltage variation at the two coils during a sudden increase of energization, so that from these measurement data a third voltage variation is calculated in a differential imager, from which a logic unit determines the position of the armature arranged and able to move between the coils, without using an additional sensor.

However, the displacement signal generated in this manner depends markedly on the size and shape of the voltage jump which, owing to conductor losses or fluctuations of the on-board electric voltage, is neither constant nor always has the same value in practice. Furthermore, with an increasing value of the time when the measurements are made after the voltage jump, the measured value is influenced adversely by temperature effects due to the ohmic fraction and by magnetic saturation effects.

From DE 19748647 C2 an electromagnetic drive system with integrated displacement signal production is known, which comprises an electric motor and consists of a first part-system having at least one permanent magnet and a second part-system with a coil arrangement comprising at least two identical part-coils arranged one behind the other. In this known system the respective part-systems form the stator or the movable armature; in addition a control circuit is provided, which serves to produce a pulse-width-modulated control voltage with constant pulse frequency and a constant switching voltage in the coil system. The known system includes an evaluation circuit which, by respective separate differentiation of the voltage variations across the part-coils and subsequent subtraction or division of the then produced new differentiated part-voltages at a respectively constant time-point after the flank inversion in the pulse-width-modulated control signal, derives a voltage value proportional to displacement or angle for the relative position between the first part-system of the motor and the second part-system. Thanks to the concept of the dual use of the drive coils there is no need for separate measurement systems for determining the position of the moving part-system relative to the fixed part-system of the drive system.

SUMMARY OF THE INVENTION

The purpose of the present invention, starting from the known prior art according to DE 102005018012 A1 by the present applicant, is to indicate a method for detecting the position of the armature of an electromagnetic actuator arranged and able to move between two coils, by the implementation of which a voltage independence of the measurement signal for the position of the armature is achieved.

According to these, a method for detecting the position of an armature of an electromagnetic actuator arranged and able to move between two coils is proposed, in which the arrangement is energized suddenly by means of a voltage jump and the voltage variation at the two coils in measured, such that from these measurement data for the voltage variation at the two coils, a voltage variation normalized in relation to the size of the voltage jump is calculated, which is independent of voltage fluctuations.

Preferably, from the measurement data for the voltage variation at a particular time-point at the two coils of the electromagnetic actuator, the quotient of the difference between the two voltage values and the voltage jump, normalized in relation to the size of the voltage jump, is calculated.

In this way each value of the quotient formed in accordance with the invention is correlated with a particular armature stroke, and this one-to-one correlation can be determined by computation, by means of a simulation, or by experimental means.

The correlation between the armature stroke and the values of the quotients formed according to the invention is stored in the control unit as a characteristic curve or, as a function of the measurement time, in the form of a matrix.

In an advantageous embodiment of the invention it is proposed to carry out the voltage measurement at the two coils at the point in time after energizing of the actuator when the gradient of the voltage variation of the voltages at the two coils assumes the value zero, i.e. the point when the voltage variations reach their apex; owing to the properties of the system the apex point of the voltage variations at the two coils is reached at the same moment in time.

In this way undesired temperature effects and magnetic saturation effects are avoided, which otherwise occur if the measurement time of the voltage at the two coils is longer than the time-point when the apex is reached.

BRIEF DESCRIPTION OF THE DRAWINGS

Below, an example of the invention is explained in more detail with reference to the attached figures, which show.

DETAILED DESCRIPTION OF THE PREFERRED EMBODIMENTS

Figure 1:
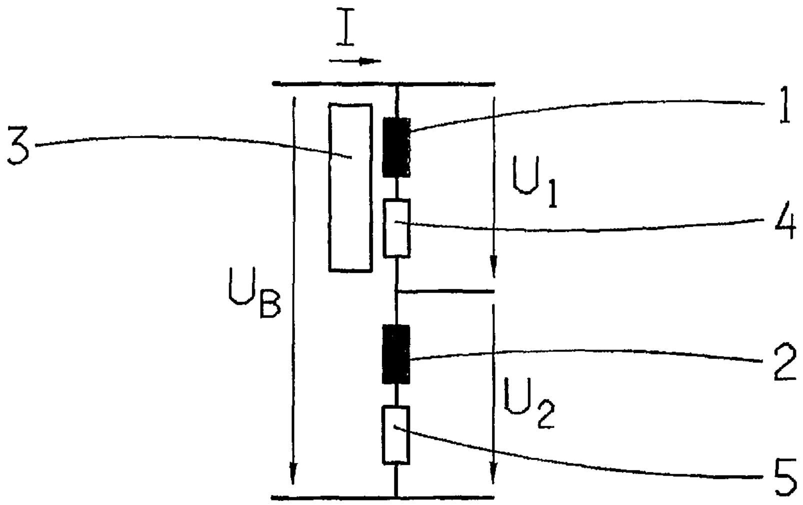
FIG. 1: A simplified diagram illustrating the principle of an electromagnetic actuator comprising an armature arranged and able to move between two coils.

FIG. 1 shows a simplified diagram illustrating the principle of an electromagnetic actuator comprising an armature arranged and able to move between two coils. In this case the first coil of the actuator is indexed 1, the second coil 2, and the armature 3. The ohmic resistances associated with the coils are indexed 4 and 5 respectively.

Figure 2:
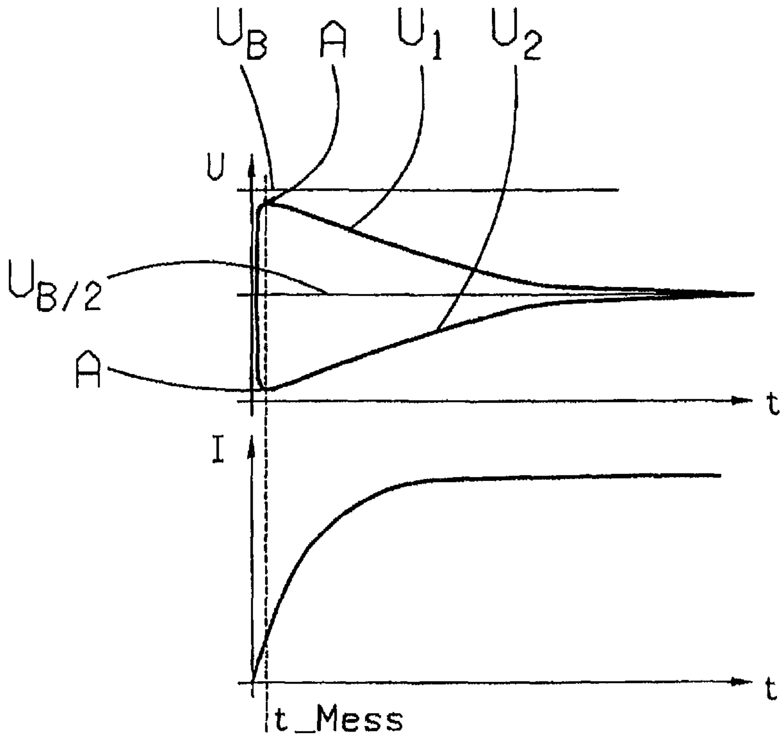
FIG. 2: A diagram showing the variations of the voltages at the two coils of the electromagnetic actuator after the application of a voltage jump, and the variation of the current after applying a voltage jump, as a function of time

According to the invention, and referring to the upper part of FIG. 2, to detect the position of the armature 3 arranged and able to move between the coils 1, 2, a voltage jump $U_B$ is applied to the series-connected coils 1, 2 of the actuator, so that the two coils 1, 2 form a voltage divider in accordance with the impedance coil principle known from measurement technology. According to the invention, the voltage $U_1$ at the first coil 1 and the voltage $U_2$ at the second coil 2 are preferably measured at a specific time t_Mess, and from these measurement data the quotient of the difference ΔU between the two voltage values and the voltage jump $U_B$, normalized in relation to the size of the voltage jump $U_B$, is calculated. The appropriate formula is:

$$\Delta U/U_B=(U_1-U_2)/(U_1+U_2)$$

In this case, at each time point t_Mess each value of the quotient formed according to the invention is correlated with a specific armature stroke, and this one-to-one correlation can be determined by computation, by means of a simulation, or by experimental means, and stored in the control unit as a characteristic curve.

It is particularly advantageous for the voltages $U_1$ and $U_2$ to be measured, after the voltage jump has been applied, at the point in time when the gradient of the voltage variations at the two coils becomes zero; this time corresponds to the time t_Mess shown in the upper part of FIG. 2; in the figure the apex point of the voltage variations at the two coils is indexed A. In the lower part of FIG. 2 the variation of the current after the application of the voltage jump $U_B$ is shown as a function of the time t.

The concept according to the invention results in the advantage that the characteristic curve produced is independent of operating voltage fluctuations. Furthermore, owing to the definition of the optimum measurement time, temperature effects or magnetic saturation effects are largely avoided.

INDEXES

1 Coil
2 Coil
3 Armature
4 Ohmic resistance
5 Ohmic resistance
$U_B$ Voltage jump
$U_1$ Voltage at coil 1
$U_2$ Voltage at coil 2
t_Mess Measurement time
I current
t Time
A Apex point

The invention claimed is:

1. A method of detecting a position of an armature of an electromagnetic actuator arranged and able to move between first and second coils, the method comprising the steps of:

applying a voltage jump to the first and the second coils of the actuator which are connected in series, and the first and the second coils forming a voltage divider in accordance with an impedance coil principle;

measuring a voltage at the first coil and a voltage at the second coil;

calculating, from the measured voltages of the first and the second coils (1, 2), quotients, in which a difference between the voltages measured at the first and the second coils is a divisor and the voltage jump is a dividend, normalized in relation to a size of the voltage jump; and correlating a specific armature stroke one-to-one with each value of the calculated quotients.

2. A method of detecting a position of an armature of an electromagnetic actuator arranged and able to move between first and second coils, the method comprising the steps of:

applying a voltage jump to the first and the second coils of the actuator which are connected in series, and the first and the second coils forming a voltage divider in accordance with an impedance coil principle;

measuring a voltage at the first coil and a voltage at the second coil;

calculating, from the measured voltages of the first and the second coils (1, 2), quotients of a difference between the voltages measured at the first and the second coils and the voltage jump, normalized in relation to a size of the voltage jump;

correlating a specific armature stroke one-to-one with each value of the calculated quotients; and determining the one-to-one correlation between the values of the calculated quotients and the armature stroke by one of computation, simulation and by experimental means.

3. The method of detecting the position of the armature of the electromagnetic actuator arranged and able to move between the first and the second coils, according to claim 2 further comprising the step of storing the one-to-one correlation, between the values of the calculated quotients and the armature stroke, in a control system as one of a characteristic curve and a function of measurement time, in a form of a matrix.

4. A method of detecting a position of an armature of an electromagnetic actuator arranged and able to move between first and second coils, the method comprising the steps of:

applying a voltage jump to the first and the second coils of the actuator which are connected in series, and the first and the second coils forming a voltage divider in accordance with an impedance coil principle;

measuring a voltage at the first coil and a voltage at the second coil;

calculating, from the measured voltages of the first and the second coils (1, 2), quotients of a difference between the voltages measured at the first and the second coils and the voltage jump, normalized in relation to a size of the voltage jump;

correlating a specific armature stroke one-to-one with each value of the calculated quotients; and measuring the quotient voltages at the first and the second coils, at a point in time after application of the voltage jump, when a gradient of the variations of the voltages at the first and the second coils becomes zero.

* * * * *